(12) United States Patent
Ansari et al.

(10) Patent No.: US 10,789,153 B2
(45) Date of Patent: Sep. 29, 2020

(54) DEBUG CONTROLLER CIRCUIT

(71) Applicant: Xilinx, Inc., San Jose, CA (US)

(72) Inventors: Ahmad R. Ansari, San Jose, CA (US); Felix Burton, Foster City, CA (US); Ming-dong Chen, Cupertino, CA (US)

(73) Assignee: Xilinx, Inc., San Jose, CA (US)

( * ) Notice: Subject to any disclaimer, the term of this patent is extended or adjusted under 35 U.S.C. 154(b) by 221 days.

(21) Appl. No.: 15/944,137

(22) Filed: Apr. 3, 2018

(65) Prior Publication Data

US 2019/0303268 A1  Oct. 3, 2019

(51) Int. Cl.
| | |
|---|---|
| *G06F 11/00* | (2006.01) |
| *G06F 11/36* | (2006.01) |
| *G01R 31/317* | (2006.01) |
| *G01R 31/3185* | (2006.01) |
| *G06F 11/22* | (2006.01) |
| *G06F 11/267* | (2006.01) |

(Continued)

(52) U.S. Cl.
CPC .... *G06F 11/3648* (2013.01); *G01R 31/31705* (2013.01); *G01R 31/318533* (2013.01); *G06F 11/2236* (2013.01); *G06F 11/267* (2013.01); *G06F 11/2733* (2013.01); *G06F 11/3636* (2013.01); *G06F 11/3656* (2013.01); *G06F 30/34* (2020.01)

(58) Field of Classification Search
CPC ............. G06F 11/3466; G06F 11/3471; G06F 11/348; G06F 11/3485; G06F 11/349; G06F 11/3495; G06F 11/3636; G06F 11/364; G06F 11/3476
USPC .......................................... 714/45
See application file for complete search history.

(56) References Cited

U.S. PATENT DOCUMENTS

| | | | |
|---|---|---|---|
| 6,212,650 B1 | 4/2001 | Guccione | |
| 6,584,587 B1 * | 6/2003 | McDermott | G06F 3/14 714/23 |

(Continued)

FOREIGN PATENT DOCUMENTS

| | | |
|---|---|---|
| EP | 1089085 | 4/2001 |
| GB | 2541216 | 2/2017 |
| WO | 2017184265 | 10/2017 |

OTHER PUBLICATIONS

Arm, "CoreSight Technical Introduction," ARM-EPM-039795, Aug. 2013, pp. 1-16, ARM Ltd., Cambridge, United Kingdom.

(Continued)

*Primary Examiner* — Sarai E Butler
(74) *Attorney, Agent, or Firm* — Crawford Maunu PLLC

(57) ABSTRACT

A circuit arrangement includes one or more input buffers disposed on a system-on-chip (SoC) and configured to receive and store streaming debug packets. One or more response buffers are also disposed on the SoC. A transaction control circuit is disposed on the SoC and is configured to process each debug packet in the one or more input buffers. The processing includes decoding an operation code in the debug packet, and determining from an address in the debug packet, an interface circuit of multiple interface circuits to access a storage circuit in a subsystem of multiple subsystems on the SoC. The processing further includes issuing a request via the interface circuit to access the storage circuit according to the operation code, and storing responses and data received from the interface circuits in the one or more response buffers.

20 Claims, 6 Drawing Sheets

(51) Int. Cl.
  *G06F 11/273* (2006.01)
  *G06F 30/34* (2020.01)

(56) References Cited

U.S. PATENT DOCUMENTS

| | | | |
|---|---|---|---|
| 6,985,980 B1 | 1/2006 | Allegrucci | |
| 8,327,200 B1 | 12/2012 | Mohan | |
| 8,595,555 B1 | 11/2013 | Taylor | |
| 8,595,561 B1 | 11/2013 | Lu et al. | |
| 9,632,895 B2* | 4/2017 | Menon | G06F 11/27 |
| 10,078,568 B1* | 9/2018 | Stoler | G06F 11/263 |
| 2006/0026470 A1* | 2/2006 | Yamashita | G06F 11/2236 |
| | | | 714/724 |
| 2008/0270844 A1* | 10/2008 | King | G06F 11/348 |
| | | | 714/43 |
| 2010/0115344 A1* | 5/2010 | Roohparvar | G11C 29/16 |
| | | | 714/42 |
| 2010/0229049 A1* | 9/2010 | Krig | G06F 13/385 |
| | | | 714/48 |
| 2013/0212425 A1* | 8/2013 | Blaine | G06F 11/3648 |
| | | | 714/6.1 |
| 2013/0339790 A1* | 12/2013 | Menon | G06F 11/2733 |
| | | | 714/30 |
| 2014/0143600 A1* | 5/2014 | Hutner | G06F 11/263 |
| | | | 714/35 |
| 2015/0226801 A1* | 8/2015 | Hopkins | G01R 31/31705 |
| | | | 714/731 |
| 2015/0234582 A1* | 8/2015 | Badea | G06F 11/3664 |
| | | | 715/771 |
| 2015/0242278 A1* | 8/2015 | Cain, III | G06F 11/141 |
| | | | 714/15 |
| 2016/0049203 A1* | 2/2016 | Alrod | G11C 16/26 |
| | | | 714/2 |
| 2016/0162375 A1* | 6/2016 | Kim | G06F 3/0619 |
| | | | 714/6.13 |
| 2016/0350209 A1* | 12/2016 | Belyy | G06F 8/70 |

OTHER PUBLICATIONS

Xilinx, "Aurora 64B/66B Protocol Specification," SP011 (v1.3), Oct. 1, 2014, pp. 1-56, Xilinx, Inc., San Jose, California, USA.

Xilinx, "Zynq UltraScale+ MPSoC," UG1085 (v.1.5), Mar. 31, 2017, pp. 1-40, Xilinx, Inc., San Jose, California, USA.

* cited by examiner

DEBUG CONTROLLER CIRCUIT

TECHNICAL FIELD

The disclosure generally relates to debugging and trace circuitry of a system-on-chip (SoC).

BACKGROUND

Many integrated circuits employ scan circuitry to aid in verifying and testing circuit operations. An example of scan circuitry is the Standard Test Access Port and Boundary-Scan Architecture, which was developed by the Joint Test Action Group (JTAG) and formalized in IEEE Standard 1149. Scan test circuitry can be employed in System-on-Chip devices (SoCs).

Complex SoCs can include multiple subsystems, such as a processor subsystem having multiple processor cores, a memory subsystem providing on-chip SRAM and/or DRAM, and a programmable logic subsystem having circuitry such as a field programmable gate array (FPGA). An SoC can also include hardwired logic that can be used to perform certain mathematical functions as directed by software executing on the processor or a circuit implemented in programmable logic of the SoC.

Testing a system implemented on an SoC can involve transfer of a large quantity of data between the SoC and a test controller such as a debugger system that executes on a host computer system. The debugger system can read data from and write data to the storage circuits within the various subsystems of the SoC. In current systems, debug steps are sequenced one-by-one from the debugger system on the host computer. The high latency involved in sequencing debug steps, along with the relatively slow dock rate at which the JTAG interface circuitry operates, for example, less than 100 MHz, can extend the time required for testing.

SUMMARY

A circuit arrangement includes one or more input buffers disposed on a system-on-chip (SoC) and configured to receive and store a plurality of streaming debug packets. One or more response buffers are also disposed on the SoC. A transaction control circuit is disposed on the SoC and is coupled to the one or more input buffers and to the one or more response buffers. The transaction control circuit is configured to process each debug packet in the one or more input buffers. The processing includes decoding an operation code in the debug packet, and determining from an address in the debug packet, an interface circuit of a plurality of interface circuits to access a storage circuit in a subsystem of a plurality of sub-systems on the SoC. The processing further includes issuing a request via the interface circuit to access the storage circuit according to the operation code, and storing responses and data received from the plurality of interface circuits in the one or more response buffers.

A system-on-chip (SOC) includes an integrated circuit (IC) die, a plurality of circuit subsystems disposed on the IC die, a plurality of interface circuits configured to access storage circuits in the plurality of circuit subsystems, and a debug circuit disposed on the IC die and coupled to the plurality of interface circuits. The debug circuit includes one or more input buffers configured to receive and store a plurality of streaming debug packets and one or more response buffers. A transaction control circuit is coupled to the one or more input buffers and to the one or more response buffers. The transaction control circuit is configured to process each debug packet in the one or more input buffers. The processing includes decoding an operation code in the debug packet, and determining from an address in the debug packet, an interface circuit of a plurality of interface circuits to access a storage circuit in a subsystem of a plurality of sub-systems on the SoC. The processing further includes issuing a request via the interface circuit to access the storage circuit according to the operation code, and storing responses and data received from the plurality of interface circuits in the one or more response buffers.

A method includes receiving and storing a plurality of streaming debug packets in one or more input buffers disposed on a system-on-chip (SoC). Each debug packet in the one or more input buffers is processed by a transaction control circuit disposed on the SoC. The processing includes decoding an operation code in the debug packet, and determining from an address in the debug packet, one interface circuit of a plurality of interface circuits disposed on the SoC to access one or more storage circuits in one of a plurality of circuit sub-systems disposed on the SoC. The processing further includes issuing a request via the one interface circuit to access the one or more storage circuits according to the operation code, and storing responses and data received from the plurality of interface circuits in one or more response buffers disposed on the SoC.

Other features will be recognized from consideration of the Detailed Description and Claims, which follow.

BRIEF DESCRIPTION OF THE DRAWINGS

Various aspects and features of the circuits and methods will become apparent upon review of the following detailed description and upon reference to the drawings in which.

DETAILED DESCRIPTION

Figure 1:
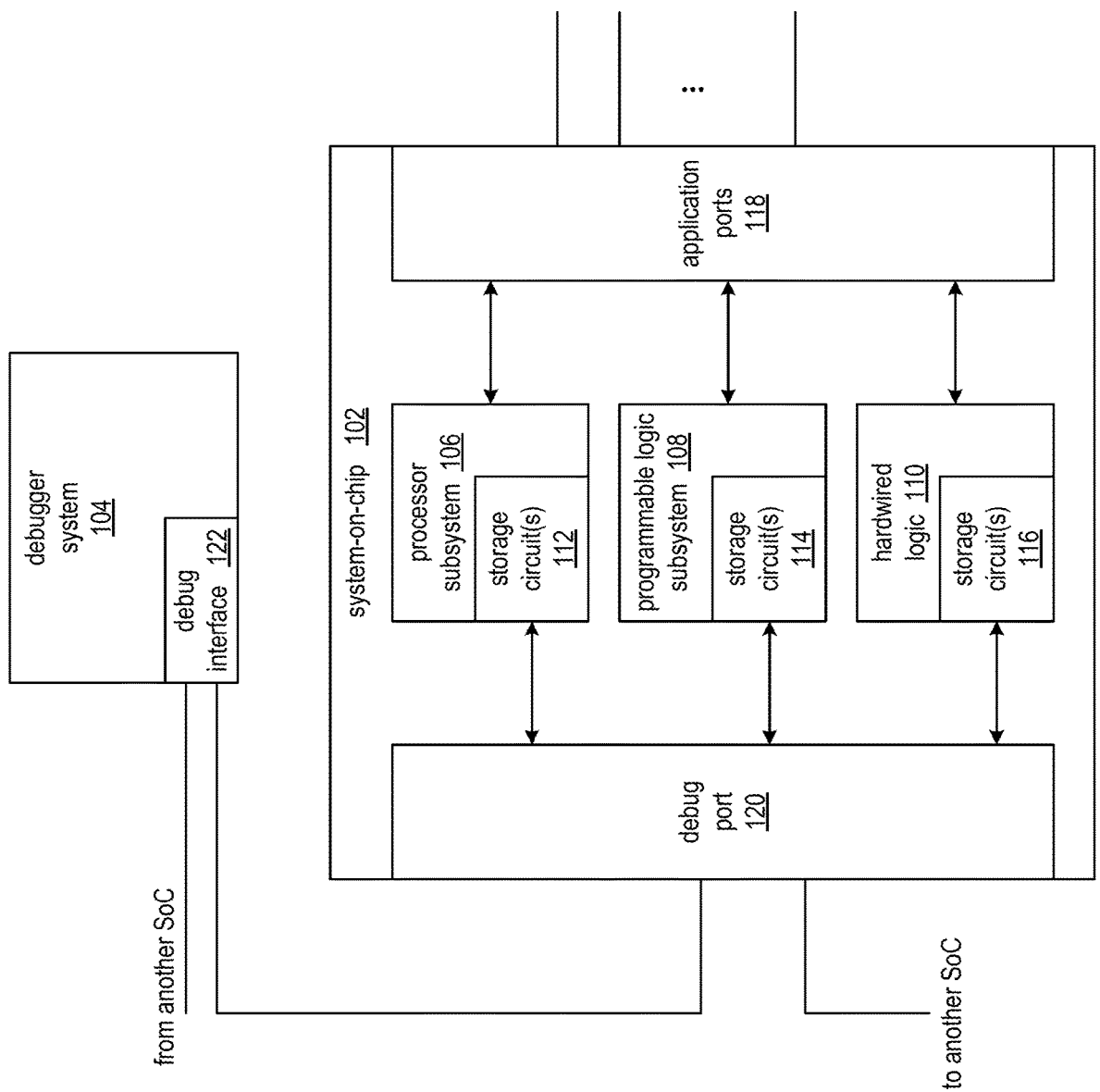
FIG. 1 shows a debugger system and a system-on-chip SoC having subsystems for implementing application software and application circuitry, along with debug circuitry for supporting debugging the application.

In the following description, numerous specific details are set forth to describe specific examples presented herein. It should be apparent, however, to one skilled in the art, that one or more other examples and/or variations of these examples may be practiced without all the specific details given below. In other instances, well known features have not been described in detail so as not to obscure the description of the examples herein. For ease of illustration, the same reference numerals may be used in different diagrams to refer to the same elements or additional instances of the same element.

The disclosed circuits and methods provide improved approaches for gathering trace data from and debugging complex SoCs. As used herein, "SoCs" will be used to refer to systems in packages, including, for example, a system constructed using stacked silicon interposer technology. The approaches provide a unified debugging interface that provides high-speed data transfer between all subsystems of the SoC and a debugger system connected to the device. The debug interfaces of multiple SoCs can be connected in a daisy chain, providing a single path for configuring, providing debug data to, and reading debug data from multiple devices.

In the exemplary circuits, a debug packet controller is disposed on an SoC. The debug packet controller can be coupled to multiple alternative interfaces for connecting to a debugger system. One external interface is a scalable, lightweight, link-layer protocol for high-speed serial communication, such as the Aurora 64B/66B interface from XILINX, Inc. The debug packet controller can be alternatively connected to a JTAG interface. The JTAG interface can be selectively enabled to access specific registers in a bridge that has direct interface to the ingress and egress streaming ports of the debug packet controller.

The debug packet controller can include one or more input buffers. The input buffers receive and store streaming debug packets, such as those issued from a debugger system. The debug packet controller further includes response buffers for buffering debug or trace data to be returned to the debugger system. A transaction control circuit of the debug packet controller is coupled to the input buffers and to the response buffers. The transaction control circuit is configured to process each debug packet in the input buffers by decoding an operation code in the debug packet. The transaction control circuit determines from an address in the debug packet, an interface circuit of a plurality of interface circuits to access a storage circuit in a subsystem of the SoC and then issues a request via the interface circuit to access the storage circuit according to the operation code. The transaction control circuit controls storage of responses and data received from the interface circuits in the response buffers.

The debug packet can include multiple operation codes. "Operation codes" as used herein refers to a main command and one or more optional subcommands that can be included in a debug packet. Each subcommand can have multiple fields.

The addressing in a debug packet can reference particular storage circuits of an SoC and also particular SoCs that are connected in a daisy chain. Each packet can have a target identifier that references a particular SoC. For a packet that is targeted for a specific SoC, if the packet is attempting to access a storage circuit within that SoC, for each of the subcommands that are included in the packet, there is an address that references the location of that storage element. The daisy chaining of SoCs enables the ability to debug multiple SoCs at the same time.

The SoC can include a processor subsystem, a programmable logic subsystem, and hardwired logic circuits, examples of which include math engine circuits that can be implemented as digital signal processors. In addressing the storage circuits of the subsystems by the debug packet, the debug packet controller determines if the target is a dedicated debug subsystem/Interconnect in the processor subsystem; a dedicated trace buffer in the processor subsystem; an SoC configuration interface for configuring the programmable logic subsystem or the processor subsystem before booting the SoC; or the main SoC switch and network-on-chip (NoC) on the device for accessing all operational registers within the system including processor subsystem registers, registers in the application circuitry implemented in the programmable logic subsystem, and registers in the math engine circuits.

FIG. 1 shows a debugger system and a system-on-chip SoC having subsystems for implementing application software and application circuitry, along with debug circuitry for supporting debugging the application. The SoC 102 has multiple subsystems, including a processor subsystem 106, which can include one or more processor cores, a programmable logic subsystem 108, which includes programmable logic and programmable interconnect circuitry, and hardwired logic circuits 110 that implement mathematical functions, for example. The hardwired logic circuits can also be referred to as "math engines." Although the hardwired logic circuits are sometimes referred to as math engines, the hardwired logic circuits can include any kind of data processing engine (DPE) such as digital signal processing engines, cryptographic engines, Forward Error Correction (FEC) engines, or other specialized hardwired circuits for performing one or more specialized tasks. In an exemplary implementation, the math engines can be interconnected using a plurality of switches for transmitting streaming data between the engines.

Each of the processor subsystem, programmable logic subsystem, and hardwired logic circuitry includes storage circuits 112, 114, and 116, respectively. The storage circuits can include memories, such as SRAM or DRAM, and/or configuration and control registers. The storage circuits 112, 114, and 116 can be accessed by an application implemented as software executing on the processor subsystem 106, by a circuit implemented in programmable logic subsystem 108, and/or by hardwired logic circuit 110.

The application executing as software on the processor subsystem and/or operating as a circuit on the programmable logic subsystem and/or operating as a circuit in the hardwired logic, inputs data from and outputs data to systems outside the SoC via the application ports 118. The application ports can include gigabit transceivers and various standards-based or proprietary bus interfaces, for example.

The SoC 102 further includes a debug port 120 that is dedicated to providing access to the storage circuits 112, 114, and 116 for the debugger system 104. The debugger system 104 can perform debugging and trace functions while the SoC is executing an application. In addition, through the debug port, the debugger system can configure the SoC with software to be executed on the processor subsystem 106 and/or configure the programmable logic subsystem 108 to implement application circuitry. The debug interface 122 on the debugger system is connected to the debug port 120. In an exemplary implementation, the debug port and debug interface communicate using the Aurora 64B/66B interface on gigabit transceivers operated in dual simplex mode to support daisy chaining and parallel debugging of multiple SoCs.

Figure 2:
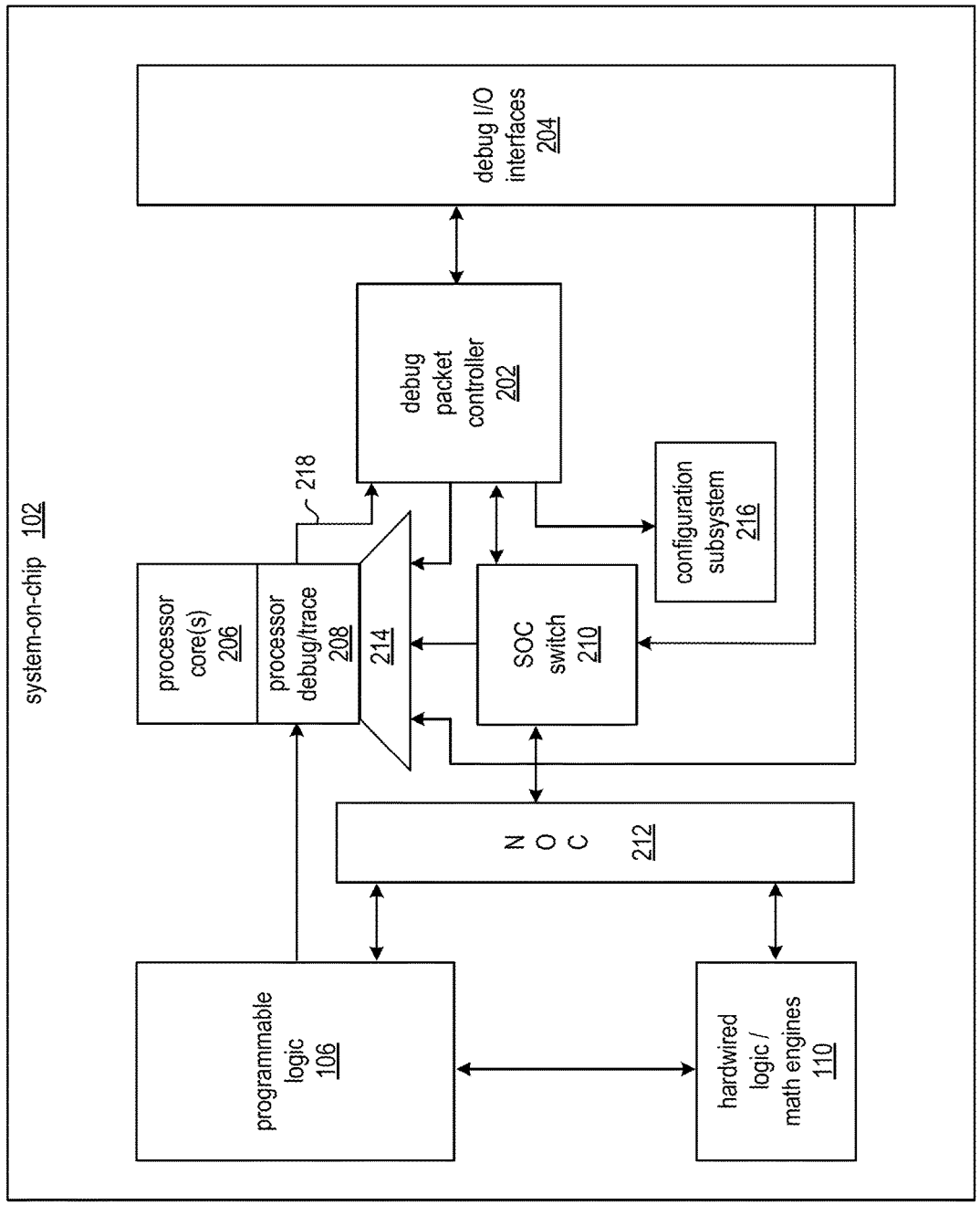
FIG. 2 shows an SoC and exemplary interfaces between subsystems of the SoC and circuitry of the debug port.

The debug port 120 includes a debug packet controller (FIG. 2, #202). The debug packet controller implements a pull model in order to retrieve data from various subsystems on the SoC 102. The flow of transactions within the SoC is from the debug packet controller to the referenced resources. Having the debug packet controller initiate the flow of transactions simplifies the design for handling trace data and passing the flow control back to the host in the debug environment. In order to support a trace mode in which trace data is pushed out of the SoC by the debug port, an output buffer (not shown) on the SoC stores the trace data in order to allow debug port to pull the data using consecutive bursts and emulate an outbound trace stream. The trace buffer can be implemented in the programmable logic subsystem 108, DRAM, on-chip memory of the processor subsystem 106, or funneled into a CoreSight trace buffer when a unified trace stream across multiple trace sources is desired.

The debug port 120 can be configured to support two modes of operation. In one mode, which can be referred to as "Normal Debug Mode," both inbound and outbound ports are used together as the debug and trace interface. Each debug operation is initiated by the debugger system 104 and can be executed through the debug port 120. In the second mode, which can be referred to as "Trace Mode," the debugger system issues one set of debug packets, and thereafter the debug port generates read requests repeatedly from the set of debug packets in order to provide an outbound trace stream. The Trace Mode can be activated by way of the "Perpetual" operation code in a debug packet.

The debug port 120 receives debug packets from the debugger system 104.

If the Aurora interface is used as the link layer interface, each debug packet can be embedded in the user protocol data unit (PDU) section of an Aurora packet, and the debug packet includes a header, an optional payload, and a CRC field. The header of the debug packet includes a Reserved field for future expansion, a Target_ID Field, a Packet Sequence Number field and a Command Opcode field. The debug packet can also include optional Payload field and a cyclic redundancy check (CRC) code.

The Target_ID field is used to identify the target SoC in a configuration that involves daisy chained SoCs. During Enumeration, each SoC passes its own Target_ID to the next SoC in the daisy chain, and the next SoC will increment the value of the Target_ID and use the incremented value as its Target_ID. The Target_ID equal to zero is reserved for the host debugger system and is typically the Target_ID that is passed to the first device in the chain from the host debugger system during enumeration. Otherwise, the hosts passes the Target_ID of the target SoC to the first SoC in the daisy chain. For every debug packet that is sent to a target SoC, a response having the same Target_ID is expected to be sent back to the debugger system.

The Sequence Number field specifies an integer that is used to track debug packets that are sent to a target SoC. Similar to the Target_ID, for every packet that is sent to a target SoC, a response having the same packet Sequence Number is expected by the debugger system. Debug packets having Reset and Get_Sequence operations codes do not require responses having the same Sequence number. If a packet is received out of sequence at an SoC and the packet is not resident in the debug port 120 of the SoC, that packet is dropped and no response is generated. If a response packet is not received by the debugger system or if there is an error in the transmission of the response, the debugger system can resend the same request packet with the same Target_ID and packet Sequence Number. In that case, the debug port will resend the response packet, if the response is still resident in the debug port.

The CRC field can be the last field of every debug packet. When the CRC of an ingress packet is invalid, the packet is dropped by the debug port. The Opcode field specifies the packet type or is used to identify the main actions that is performed by the packet. The value in the Opcode field can be referred to as an "operation code." When a packet is handled successfully by debug packet controller, the Opcode field in the response packet, which will have the same Sequence Number as in the debug command packet, will indicate an OK status for all queued packets and indicate a Special_OK status for non-queued packets. Examples of non-queued debug packets are those having Reset and Get_Sequence operation codes. On the other hand, a debug packet that is not handled by any target SoC will be received by the debugger system with the Opcode field unmodified.

Exemplary operation codes in the main Opcode field include Enumerate, Reset, Get_Sequence, and Memory. In a debug packet having a Memory operation code, one or more specific access operations can be specified as explained further below. The additional specific access operations of a Memory code can also be referred to as "subcommands." The operation code in the main Opcode field and the memory subcommands can all be referred to generally as operation codes.

The Enumerate operation can be used to assign target identifiers to be referenced by Target_IDs to the SoCs in a chain. Upon receipt of a debug packet having an Enumerate operation code, the receiving SoC increments the value of Target_ID in the ingress packet and assigns the incremented value as its own Target_ID. The debug packet controller can store the incremented Target_ID value in a local register (not shown). Next, the debug packet controller will send the debug packet having the incremented Target_ID to the next SoC. The process is repeated until the debug packet with the Target_ID of the last device is received by the debugger system. If the Target_ID is 255, the packet will be forwarded as is and without any action being taken. The debug packet controller on each SoC expects the Sequence number in the next debug packet received to be the Sequence number of the Enumerate debug packet plus 1. When an Enumerate packet is received, the debug port should be in the reset state and not processing any other debug packets. If not, the debug port on every target device must be reset before an Enumerate packet is sent by the host debugger system. When the Enumerate packet is received, it is possible that the debug port was already in the middle of processing packets. Therefore, an Enumerate packet command also serves as the reset of the debug port for all the SoCs within the system, and upon receipt of the Enumerate packet, the packet that is being streamed out will be terminated, the packet buffer pointers are reset.

The Reset operation can be used to reset all pending operations in a target SoC. Upon receipt of a Reset packet, if any packet is being streamed out, the packet will be terminated and no Response will be generated for all the pending packets that were terminated. Additionally, the packet buffer pointers are reset. The response packet uses the Special_Okay code to signal to the host debugger system to not mistake the response packet for a previously queued packet with the same Sequence Number whose response was already queued up and is being sent back to the host.

The Get_Sequence operation can be used to provide the expected Sequence Number for the next debug packet on an SoC identified by the Target_ID value. The Sequence Number field of the Get_Sequence packet is 0 and is ignored by debug port. The next sequence number is passed in the Sequence Number field of the response packet. The response packet for the Get_Sequence packet also uses a Special_Okay code to indicate to the host debugger system to not mistake this packet with another packet that was already queued up.

A debug packet having a Memory operation code can have multiple subcommands that access referenced memory addresses. The debug packet controller decodes the subcommands, determines the interface circuit to which an access request should be issued, and issues the access request. The addresses in the debug packet can reference the storage circuits 112 of the processor subsystem 106, storage circuits 114 of the programmable logic subsystem 108, or storage circuits 116 of the hardwired logic circuitry 110.

A Memory command packet can include one or more data transfer operations that are specified in the Payload section of the packet and are executed by the debug packet controller. All debug and trace data is transferred from the target SoC to the host debugger system in response to Memory debug packets that are generated by the host debugger system. The memory operations that are specified in the Payload section of the packet can be single, burst, or stream (FIFO) transactions to any address within the address space of the SoC 102. All memory operations included in a memory access debug packet collectively carry a single Sequence Number that is specified in the Header of the packet. The debug packet controller generates one response back to the host debugger system for each Memory debug packet. The Retry operation is carried out at the packet level which corresponds to the collection of memory operations. The Retry operation of a Memory packet does not cause the memory subcommands to be executed on the SoC. A Retry operation causes the debug packet controller to resend the response packet back to the host debugger system if the response packet is present in the outbound buffer. The Opcode in the response packet indicates an OK, or an invalid status if the packet is inconsistent with the implementation.

The different subcommands that can be included in a Memory debug packet include: Read_Mem_Op, Write_Mem_Op, Stream_Mem_Op, Perpetual, TestMem_Mem_Op, TestCond_Mem_Op, GetCond_Mem_Op, SkipIf_Mem_Op. The Read_Mem_Op subcommand can be used to initiate a read operation on the SoC 102. A debug packet having the Read_Mem_Op subcommand specifies a size (e.g., the number of bits in a beat), length (e.g., the number of beats), and an address. The response issued by the debug packet controller to a Read_Mem_Op subcommand can include the data read from the referenced address.

The Write_Mem_Op subcommand can be used to initiate a write operation on the SoC 102. A debug packet having the Write_Mem_Op subcommand specifies a size, length, an address, and data to be written to the address. The debug packet controller does not issue a response to a Write_Mem_Op subcommand.

The Stream_Mem_Op subcommand can be used to read values from a FIFO buffer that has a fixed access address, for example, to read 8 words (or beats) from a fixed address. As the FIFO buffer may not be full, 3 valid words and 5 invalid words might be returned. The debug packet controller would provide the 3 valid words in the response. The Count field in the response indicates the quantity of valid data returned. The Stream_Mem_Op can be included in at least one of the debug packets that are indefinitely executed in the trace mode as described above.

In response to a Perpetual operation code, the debug packet controller repeats the commands in all four buffers indefinitely until a "Reset," "Enumerate," or "Get_Seqence_Number" is issued by the host debugger system. The Perpetual operation code eliminates the need for a memory mapped location to start the trace mode. To use the Perpetual operation code, the user issues a number of debug packets and then issues a debug packet having the Perpetual opcode. In an exemplary current implementation, there are 4 packet buffers and as a result the number of queued packets the debug packet controller operates on in response to a Perpetual operation code is 4, excluding Perpetual packet itself. The debug packet controller then executes operations in the buffered packets. Each response has an incremented Sequence ID.

The debug packet controller provides mechanisms for the storage circuits, such as trace buffers and debug elements, to be accessed based on the conditions of other storage elements within the system. This feature allows multiple trace or debug elements to be accessed concurrently and speculatively in one packet rather than involving the host debugger system in checking the status of these buffers and accessing them only if conditions are favorable (e.g., full or ready). Involving the host debugger system in checking the status would incur considerable turnaround time.

The TestMem_Mem_Op subcommand can be used to set one or more bits in a condition register if a data value, which is referenced by an address in the debug packet, ANDed with a mask value in the debug packet, is equal to a compare value in the debug packet. If the result of the AND is not equal to the compare value, the bit(s) in the condition register are cleared.

TestCond_Mem_Op subcommand can be used to set one or more bits in a condition register if one or more bits of the condition register, which are referenced by a field in the debug packet, ANDed with a mask value in the debug packet, is equal to a compare value in the debug packet. If the result of the AND is not equal to the compare value, the bit(s) in the condition register are cleared.

The SkipIf_Mem_Op subcommand can be used to skip processing of memory subcommands in a debug packet to a location within the command payload represented by a destination field of the SkipIf_Mem_Op subcommand, if bits of the condition register specified in the subcommand are equal to the True field in the subcommand. If the compared values are not equal, next consecutive memory subcommand in the debug packet is processed.

A GetCond_Mem_Op subcommand can be used by the host debugger system to explicitly return the state of the condition register so that the host debugger system can determine whether a SkipIf_Mem_Op caused skipping of subcommand and whether or not the host debugger system should expect a response from a read or write operation that followed the SkipIf_Mem_Op.

FIG. 2 shows an SoC 102 and exemplary interfaces between subsystems of the SoC and circuitry of the debug port 120 (FIG. 1). The circuitry of the debug port generally includes a debug packet controller 202 and a debug I/O interface 204. The debug packet controller 202 is responsible for processing debug packets received from the debugger system 104 (FIG. 1). The debug I/O interface is a high-speed interface on the SoC through which debug packets are passed to the debug packet controller and responses are returned to the debugger system by the debug packet controller. The debug I/O interfaces can include the Aurora interface described above and a JTAG interface.

The debug packet controller 202 receives and stores debug packets received from the debugger system 104 in buffer circuitry. The operation codes in the debug packets are decoded by the debug packet controller, and based on the operation codes the debug packet controller determines destinations and performs high-level flow control and management tasks. The debug packet controller determines the proper interface circuit to which a request should be routed based on the addresses in the debug packets. Requests are issued by the debug packet controller on the proper interface circuit, and responses to the requests are stored in an output data buffer, which can be is accessed by the debug I/O interfaces 204.

The debug packet controller 202 determines if the address in a debug packet references a storage circuit of a processor subsystem 106 on the SoC 102, a storage circuit of a programmable logic subsystem on the SoC, or a storage circuit of a math engine circuit on the SoC. More specifically, the addressed target can be a dedicated debug subsystem/Interconnect in the processor subsystem; the dedicated trace buffer in the processor subsystem; the device configuration subsystem 216 interface for configuring the processor core(s) 206 of the processor subsystem or the programmable logic subsystem 106 before boot; and the SoC switch 210 and network-on-chip (NoC) 212 for accessing all operational registers within the system including registers of the processor subsystem, registers of the circuits implemented in the programmable logic subsystem, and registers in the hardwired logic/math engines 110.

The processor subsystem can include a processor debug/trace circuit 208, which can provide debug access to the storage circuits of the processor subsystem and also buffer and assemble trace data from the processor subsystem and also from the different subsystems on the SoC. An example of the processor debug/trace circuitry 208 is the ARM CoreSight debugger.

The debug packet controller 202 can selectively and directly receive trace data from the processor debug/trace circuit as shown by signal line 218. Alternatively, the debug packet controller can issue read and write requests via the multiplexer circuitry 214 to access the storage circuits of the processor subsystem through the processor debug/trace circuit 208. Access to the storage circuits of the processor subsystem can further be provided to off-SoC circuits via the debug I/O interfaces 204 and to on-SoC components via the SoC switch 210.

The debug packet controller 202 can also interface to the configuration subsystem 216. The configuration subsystem can include circuitry such as a configuration access port that accesses the configuration memory (not shown) of the programmable logic 106. The debug packet controller can issue write requests to the configuration subsystem with data from debug packets to be stored in the configuration memory in order to implement a circuit in the programmable logic 106. The debug packet controller can also issue read requests to read back configuration data from the configuration memory.

Figure 3:
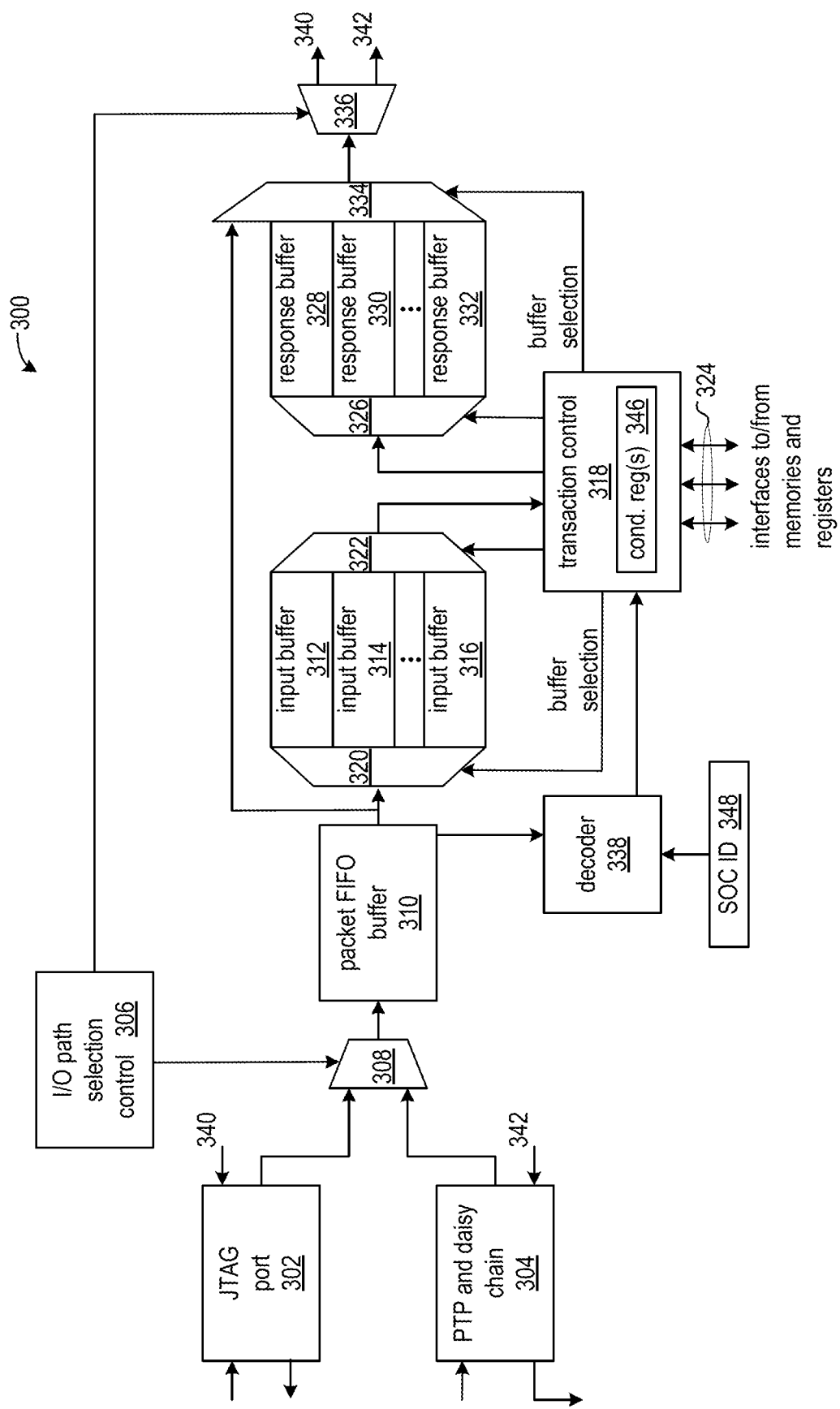
FIG. 3 shows an exemplary implementation of debug circuitry of an SoC.

FIG. 3 shows an exemplary implementation of debug circuitry 300 of an SoC. The debug circuitry 300 includes logic of the debug packet controller 202 and the debug I/O interfaces shown in FIG. 2. The debug packet controller is configurable to select from either a JTAG port 302 or a daisy-chained or a point-to-point (PTP) and daisy chain connection 304. Another port, which is not shown, can be to receive debug packets and send responses to local debugger circuitry such as can be implemented on the programmable logic subsystem. The I/O path selection control 306 can be configurable, such as with a register (not shown), to select the desired input path by multiplexer 308.

The JTAG port can include a JTAG to AXI Stream bridge (not shown). The bridge can be based on a security gate and de-serializer that allows users to send debug packets to the debug packet controller through a tap in the JTAG chain. The bridge to the debug packet controller provides fast data transfer rates due to a streamlined and low-overhead design. The bridge also allows testing the functionality of the debug packet controller without requiring Aurora based functionality.

The JTAG interface can be useful in trace mode. Ingress (inbound) debug packets can be accessed through JTAG and egress (outbound) response data can be output via the PTP interface. In the trace mode, a limited number of packets are input, e.g., 4 packets in the exemplary implementation, while a very large number of outbound trace packets are generated.

PTP and daisy chain port 304 can be implemented using the Aurora interface from XILINX, Inc. The Aurora interface implements a light-weight link-layer protocol that can be used to move data point-to-point across one or more high-speed serial lanes. The Aurora interface is simple and can be implemented with low overhead, supports daisy chaining of multiple devices with a single cable, and can be potentially used as a raw streaming output interface. The Aurora protocol bridge is responsible for the Physical and Link Layers of the Debug Interface. The Aurora subsection handles the electrical signaling and the clock and symbol coding. If dynamic channel bonding is supported in the IP, Aurora also prepares channels for single- and multi-lane configurations and controls the mapping of data to individual lanes or Data Striping. Aurora allows idle sequences within debug packets and therefore eliminates the need to buffer the entire packets. In an exemplary implementation, the Aurora interface is configured to implement 64b/66b encoding in simplex mode with 2 separate channels. The Aurora interface is configured to support framing in order to encapsulate debug packets.

The debug packet controller can queue or bypass queuing of a debug packet depending on the Target_ID and main operation code in the debug packet. Queued packets are queued in the debug packet controller input buffers, which in an exemplary implementation provide storage for four debug packets, and are applied to the SoC in order. All debug packets having memory operations and that have a Target_ID that matches the target identifier of the SoC of the receiving debug packet controller, and that are not interpreted as Retry packets are queued and buffered.

Non-Queued debug packets are processed as soon as identified by the debug packet controller and may or may not be stored locally depending on the operation code and the availability of the egress channel. In addition to debug packets having operation codes of Enumerate, Reset, and Get_Sequence, a debug packet having a Target_ID that references another SoC is not queued. The debug packet having a non-matching Target_ID is directly forwarded as long as the outbound channel is not busy transferring the response of a queued packet. Retry debug packets are also not queued. A Retry debug packet is a packet that is sent again by the host debugger system and the response happens to still be present in an output buffer of the debug packet controller. The response to a Retry debug packet will be the next response sent, followed by the transfer of the response to a debug packet that was already scheduled to be sent.

The control and flow of debug packets to an SoC is managed by the host debugger system 104 (FIG. 1). The host debugger system is expected to not send more than 4 Queued debug packets to an SoC until the response to the first Queued debug packet is received. If the host debugger system attempts to send a 5th Queued debug packet before the response to the first debug packet has been transmitted by the debug packet controller, the debug packet will be dropped by the debug packet controller, and no response will be generated for the debug packet. Although, the host debugger system can detect this occurrence and correct execution, the host debugger system is expected to track the packets that have been sent and responded to and not issue excessive requests. The debug packet controller can accept a fifth packet that is a Non-Queued debug packet.

The debug packet controller temporarily stores each input debug packet in the packet first-in-first-out (FIFO) buffer 310. The decoder circuit 338 decodes the header of the packet (first word) at the head of the FIFO buffer in order to determine whether the packet is be queued in one of the input buffers 312, 314, . . . , 316, or is to directly exit the debug packet controller. If the egress port is busy transferring a response or another debug packet, the inbound debug packet will be stored in the FIFO buffer 310 until the output port becomes available.

The decoder circuit 338 performs a first-level decoding of the header of the debug packet for purposes of signaling the transaction control circuit 318 as to whether the packet should bypass the input buffers 312, 314, . . . , 316. For example, if the Target ID specified in the debug packet does not match the SoC ID in register 348, the decoder circuit 338 signals the transaction control circuit 318 that none of the input buffers should be enabled for storage of the debug packet, and the debug packet on the bypass path should be selected by multiplexer 336.

If the Target ID in the debug packet matches the SoC ID (the Target_ID of the device) in the register 348 and the debug packet is not one of the non-queued packet types described above, the decoder circuit 338 signals the transaction control circuit 318 that the debug packet is available to store in one of the input buffers 312, 314, . . . , 316. The transaction control circuit selects an available one of the input buffers, and by way of demultiplexer 320 directs the debug packet for storage in the selected input buffer. If all the input buffers are full, the debug packet is not stored in any of the input buffers and is discarded.

The transaction control circuit 318 by way of multiplexer 322 selects a debug packet for processing. For debug packets having operation codes that specify access to storage circuits, the transaction control circuitry selects one of the interface circuits to the different subsystems of the SoC based on the address in the debug packet. Signal lines 324 connect to the different interfaces to the subsystems.

Response packets having data retrieved from the subsystems or data provided by the transaction control circuit 318 are stored in the response buffers 328, 330, . . . , 332. The transaction control circuit uses demultiplexer 326 to direct the response packet to an available one of the response buffers.

As response packets become available in the response buffers, by way of multiplexer 334 the transaction control circuit selects a response packet from one of the response buffers for output. The selected response packet is directed to demultiplexer 336. The outputs 340 and 342 from multiplexer 336 are connected to the inputs of JTAG port 302 and PTP and daisy chain port 304.

The transaction control circuit includes a condition register 346 that can used in tracking the results of the test operations, such as TestMem_Mem_Op and TestCond_Mem_Op. The value(s) in the condition register can also be used to control the flow of processing of operations in a debug packet.

Figure 4:
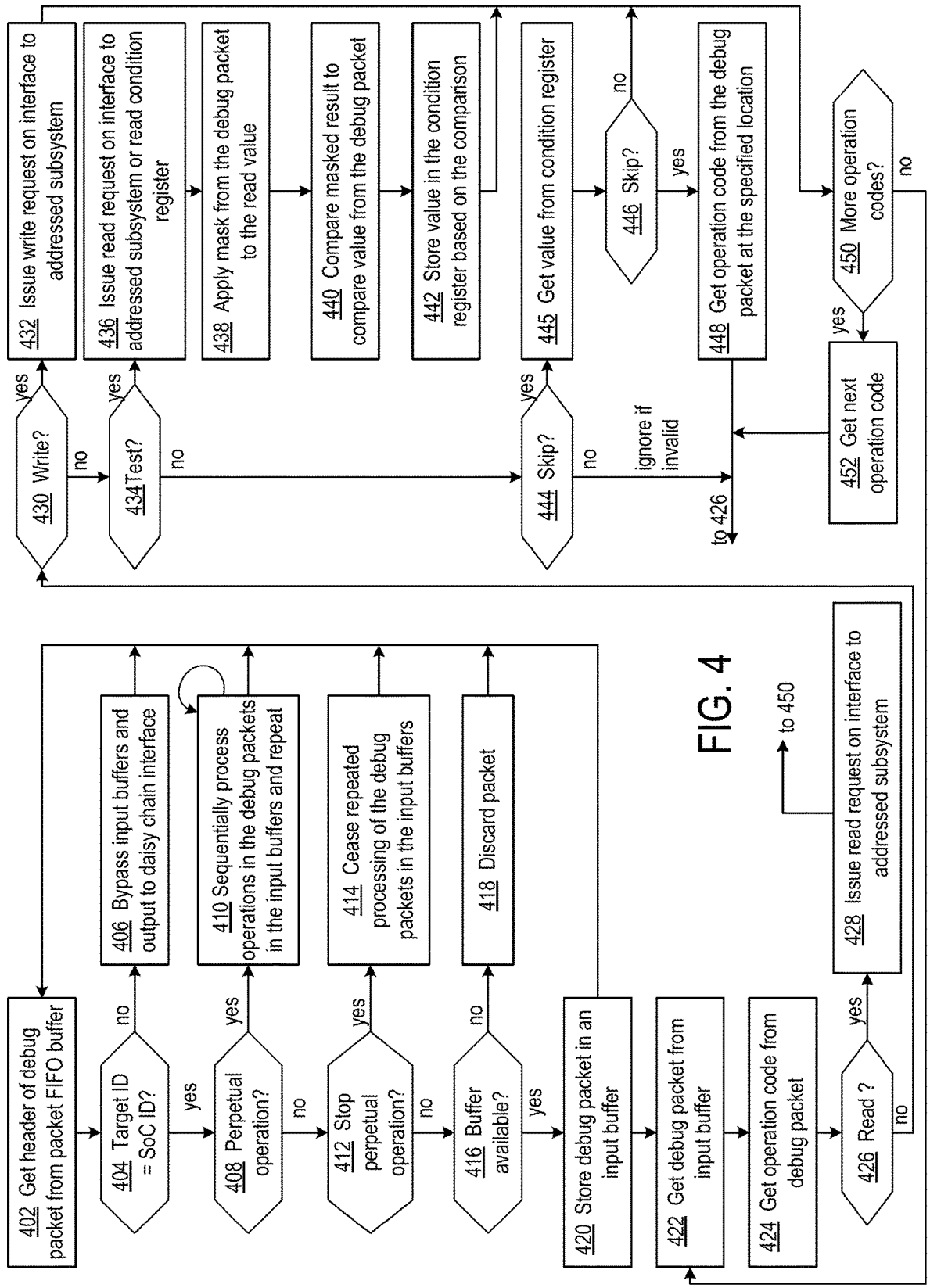
FIG. 4 is a flowchart that illustrates processing of debug packets by the debug packet controller.

FIG. 4 is a flowchart that illustrates processing of debug packets by the debug packet controller. At block 402, the debug packet controller reads the header of the debug packet at the head of the packet FIFO buffer 310 (FIG. 3). If the Target_ID in the packet header is not equal to the device identifier of the SoC, decision block 404 directs the process to block 406, wherein the debug packet controller bypasses queuing of the debug packet in the input buffers 312, 314, . . . , 316 (FIG. 3) and outputs the packet to the next SoC in the daisy chain. The debug packet controller then returns to block 402 to read the header of the next packet in the packet FIFO buffer.

If the Target_ID in the packet header is equal to the identifier of the SoC, at decision block 408, the debug packet controller determines if the operation code in the header is Perpetual operation. In response to detecting the Perpetual operation code, at block 410 the debug packet controller sequentially processes the operation codes in the debug packets present in the input buffers 312, 314, . . . , 316. That is, the debug packet controller repeats for the debug packets in the input buffers, the decoding of the operation codes, determining interface circuits, and issuing requests until a Reset debug packet is detected in the packet FIFO buffer 310 by decision block 412. The processing of operation codes in a debug packet is shown as blocks 422-452. At block 414, the debug packet controller ceases the decoding of operation codes of the packets currently in the input buffers 312, 314, . . . , 316 in response to a Reset debug packet. If the next packet has a Perpetual operation code, the debug packet controller repeats the execution of commands in the packets in the input buffer. While the debug packet controller is in Perpetual operation mode, the debug packet controller continues to monitor the packet FIFO buffer for debug packets directed to other SoCs or a debug packet that stops the Perpetual operation mode.

At decision block 416, when the debug packet controller is not operating in Perpetual operation mode, the debug packet controller determines whether or not there is buffer storage available for the packet at the head of the packet input buffers 312, 314, . . . , 316. If no space is available in the input buffers, the packet is discarded at block 418, and control is returned to block 402. If storage is available in the input buffers, at block 420, the debug packet controller stores the debug packet in one of the input buffers and returns to block 402 to get the header of the next packet now at the head of the packet FIFO buffer. In parallel therewith, the debug packet controller continues at block 422. Note that the debug packet controller checks for available buffer space at block 416 and stores the packet in an input buffer at block 420 only for queued packets.

At block 422, the debug packet controller gets a debug packet from one of the input buffers 312, 314, . . . , 316 and at block 424 the debug packet controller gets an operation code from the debug packet. The operation code can be one of the subcommands described above.

If the debug packet controller detects a Read operation code, decision block 426 directs the process to block 428. At block 428, the debug packet controller issues a read request on the interface to the addressed subsystem of the SoC. The debug packet controller then continues at block 450 to check for more operations codes in the debug packet. If there are no further operation codes in the debug packet, the process returns to block 422 to get the next debug packet from the input buffers. In an exemplary implementation, the debug packet controller processes the debug packets in the input buffers 312, 314, . . . , 316 in a round-robin order. If there are more unprocessed operation codes in the debug packet, at block 452 the debug packet controller gets the next operation code from the packet and returns to decision block 426. The operation codes in a packet are processed in sequential order unless a Skip operation alters the flow.

If the debug packet controller detects a Write operation code, decision block 430 directs the process to block 432. At block 432, the debug packet controller issues a write request on the interface to the addressed subsystem of the SoC. The debug packet controller then continues at block 450 as described above.

If the debug packet controller detects a Test operation, decision block 434 directs the process to block 436. For a Test Memory operation code, at block 436, the debug packet controller issues a read request on the interface to the addressed subsystem of the SoC. At block 438, the debug packet controller performs a logic function (e.g., AND) of the data value by the read request with a mask value associated with the test operation in the debug packet. At block 440, the debug packet controller compares the result of the logic function to a compare value associated with the test operation. At block 442, the debug packet controller stores a value in the condition register 346 (FIG. 3) based on the comparison results. For example, if the comparison results indicate that the compare value is equal to the results of the logic function, a logic value 1 can be stored in the condition register. Otherwise, a logic value can be stored in the condition register. The debug packet controller then continues processing at decision block 450.

Another type of Test operation is a Test Condition. As described above, the TestCond_Mem_Op tests the value in the condition register 346 or a portion of the condition register. The processing of the Test Condition operation code by the debug packet controller is similar to the processing of the Test Memory operation code, except that a value is read from the condition register instead of reading a value from an address of one of the SoC subsystems.

At decision block 444, the debug packet controller checks for a Skip operation (e.g., SkipIf_Mem_Op). For a Skip operation, at block 445 the debug packet controller gets a value from the condition register 346. The Skip operation can be used to skip processing of memory operations in a debug packet to the location within the command payload of the debug packet. The location is represented by a destination field of the SkipIf_Mem_Op subcommand. If bits of the condition register specified in the subcommand are equal to the True field in the subcommand, at block 446 the debug packet controller skips to the specified location and gets the operation code at that location at block 448. If the compared values are not equal, the debug packet controller continues a block 450 to check for more operation codes.

Figure 5:
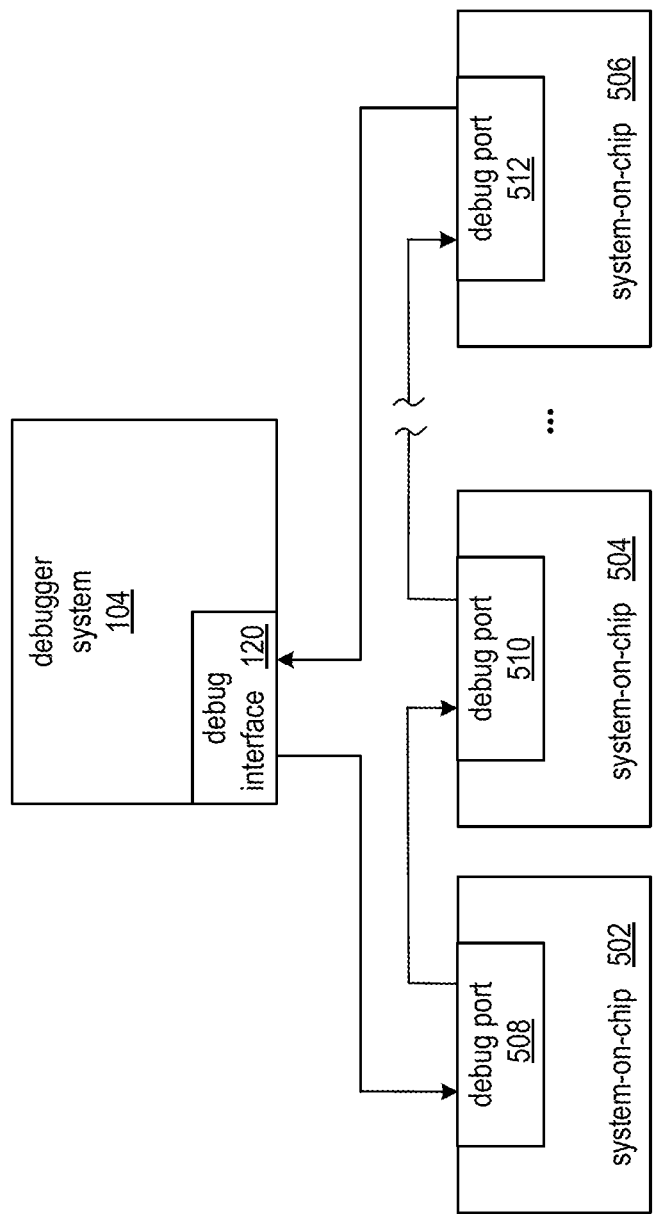
FIG. 5 shows an application of a point-to-point (PTP) debug interface that supports daisy chaining debug circuitry in multiple SoCs.

FIG. 5 shows an application of a point-to-point (PTP) debug interface that supports daisy chaining debug circuitry in multiple SoCs. The arrangement includes a debugger system 104 (FIG. 1) and multiple SoC 502, 504, . . . , 506 connected by debug ports 508, 510, . . . , 512. The debug ports can be implemented as shown by debug port 120 of FIG. 1, and the debug packet controller and debug I/O port shown and described in FIGS. 2 and 3.

Debug packets issued by the debugger system 104 have Target_ID values that reference the targeted ones of the SoCs 502, 504, . . . , 506. A debug packet issued by the debugger system is first routed to debug port 508 on SoC 502. The Target_ID value matches the device identifier of SoC 502, the operation(s) in the debug packet is processed by the debug packet controller in the debug port 508. If the Target_ID value does not match the device identifier of SoC 502, the debug port 508 forwards the debug packet to the next SoC 504 in the daisy chain. The debug packet is forwarded along the daisy chain until the Target_ID value matches the SoC device identifier. The daisy chaining of the debug ports allows the SoCs to be debugged in parallel. Responses from the debug ports 508, 510, . . . , 512 are also passed along the daisy chain to the debugger system 104.

Figure 6:
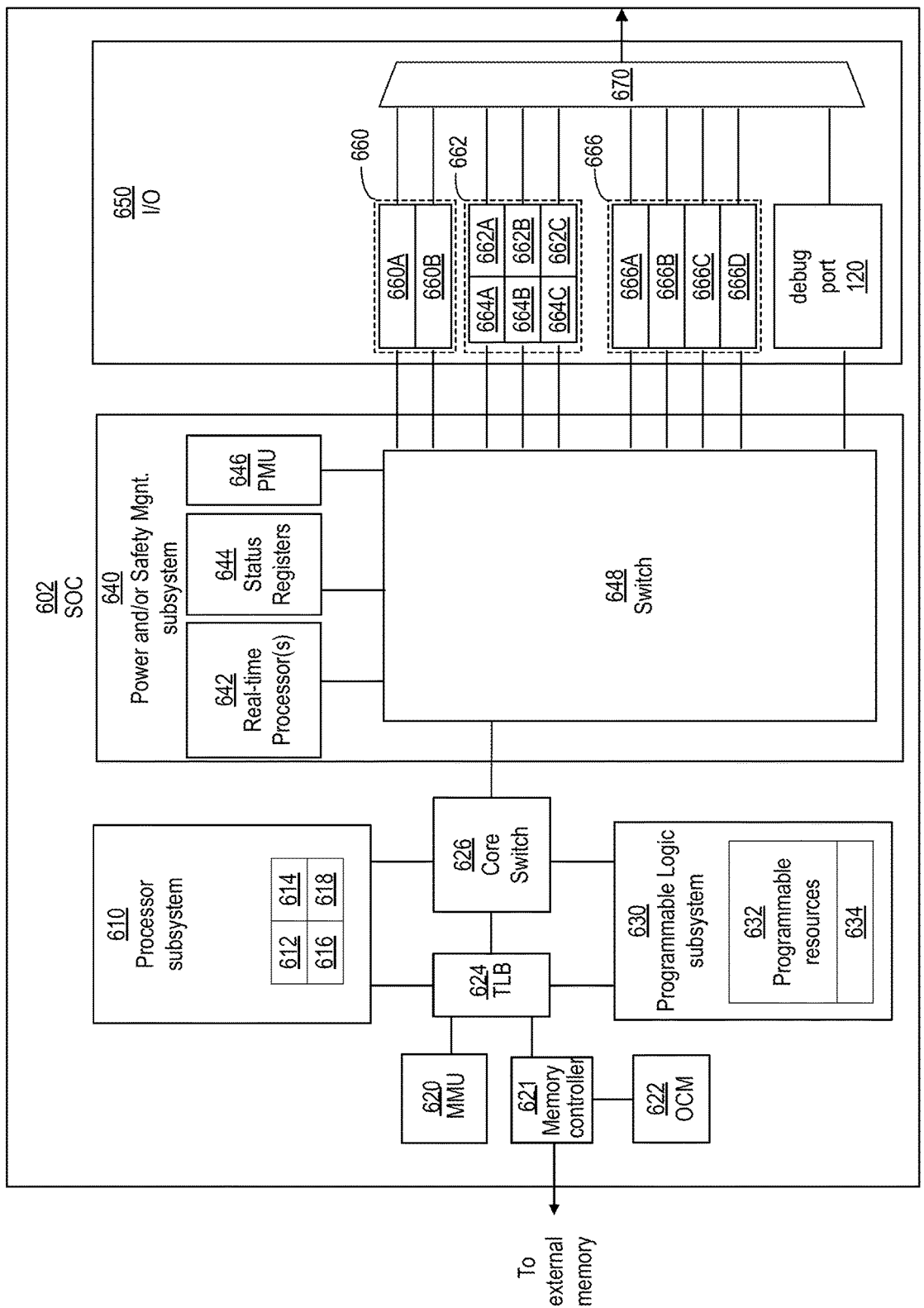
FIG. 6 shows an exemplary programmable IC that can be configured in accordance with the disclosed circuitry.

FIG. 6 shows an exemplary programmable IC 602 that can be configured in accordance with the disclosed circuitry. The programmable IC may also be referred to as an SoC, which includes a processor subsystem 610 and a programmable logic subsystem 630. The processor subsystem 610 may be programmed to implement a software portion of the user design, via execution of a user program. The program may be specified as part of a configuration data stream or may be retrieved from an on-chip or off-chip data storage device. The processor subsystem 610 may include various circuits 612, 614, 616, and 618 for executing one or more software programs. The circuits 612, 614, 616, and 618 may include, for example, one or more processor cores, floating point units (FPUs), an interrupt processing unit, on chip-memory, memory caches, and/or cache coherent interconnect.

The programmable logic subsystem 630 of the programmable IC 602 may be programmed to implement a hardware portion of a user design. For instance, the programmable logic subsystem may include a number of programmable resources 632, which may be programmed to implement a set of circuits specified in a configuration data stream. The programmable resources 632 include, for example, programmable interconnect circuits, programmable logic circuits, and configuration memory cells. The programmable logic implements the logic of a user design using programmable elements that can include, for example, function generators, registers, arithmetic logic, and so forth. Programmable interconnect circuits may include a large number of interconnect lines of varying lengths interconnected by programmable interconnect points (PIPs).

The programmable resources 632 may be programmed by loading a configuration data stream into the configuration memory cells, which define how the programmable interconnect circuits and programmable logic circuits are configured. For example, setting a configuration memory cell for a configurable latch to a first value may direct the configurable latch to operate as a single-edge-driven latch. Setting the configuration memory cell to a second value may direct the configurable latch to operate as a double-edge-driven latch. The collective states of the individual memory cells then determine the function of the programmable resources 632. The configuration data can be read from memory (e.g., from an external PROM) or written into the programmable IC 602 by an external device. In some implementations, a configuration controller 634 included in the programmable logic subsystem 630 may program the programmable resources, in response to powering on the programmable IC, by retrieving configuration data from a non-volatile memory coupled to the programmable IC and loading the configuration data into the configuration memory cells. In some other implementations, the configuration data may be loaded into the configuration memory cells by a start-up process executed by the processor subsystem 610.

The programmable IC 602 may include various circuits to interconnect the processor subsystem 610 with circuitry implemented within the programmable logic subsystem 630. In this example, the programmable IC 602 includes a core switch 626 that can route data signals between various data ports of the processor subsystem 610 and the programmable logic subsystem 630. The core switch 626 may also route data signals between either of the programmable logic or processing subsystems 610 and 630 and various other circuits of the programmable IC, such as an internal data bus. Alternatively or additionally, the processor subsystem 610 may include an interface to directly connect with the programmable logic subsystem—bypassing the core switch 626. Such an interface may be implemented, for example, using the AMBA AXI Protocol Specification (AXI) as published by ARM.

In some implementations, the processor subsystem 610 and the programmable logic subsystem 630 may also read or write to memory locations of an on-chip memory 622 or off-chip memory (not shown) via memory controller 621. The memory controller 621 can be implemented to communicate with one or more different types of memory circuits including, but not limited to, Double Data Rate (DDR) 2, DDR3, Low Power (LP) DDR2 types of memory, whether 16-bit, 32-bit, 16-bit with ECC, etc. The list of different memory types with which memory controller 621 is able to communicate is provided for purposes of illustration only and is not intended as a limitation or to be exhaustive. As shown in FIG. 6, the programmable IC 602 may include a memory management unit 620 and translation look-aside buffer 624 to translate virtual memory addresses used by the subsystems 610 and 630 to physical memory addresses used by the memory controller 621 to access specific memory locations.

The programmable IC may include an input/output (I/O) subsystem 650 for communication of data with external circuits. The I/O subsystem 650 may include various types of I/O devices or interfaces including for example, flash memory type I/O devices, higher performance I/O devices, lower performance interfaces, debugging I/O devices, and/or RAM I/O devices.

The I/O subsystem 650 may include one or more flash memory interfaces 660 illustrated as 660A and 660B. For example, one or more of flash memory interfaces 660 can be implemented as a Quad-Serial Peripheral Interface (QSPI) configured for 4-bit communication. One or more of flash memory interfaces 660 can be implemented as a parallel 8-bit NOR/SRAM type of interface. One or more of flash memory interfaces 660 can be implemented as a NAND interface configured for 8-bit and/or 16-bit communication. It should be appreciated that the particular interfaces described are provided for purposes of illustration and not limitation. Other interfaces having different bit widths can be used.

The I/O subsystem 650 can include one or more interfaces 662 providing a higher level of performance than flash memory interfaces 660. Each of interfaces 662A-662C can be coupled to a DMA controller 664A-664C respectively. For example, one or more of interfaces 662 can be implemented as a Universal Serial Bus (USB) type of interface. One or more of interfaces 662 can be implemented as a gigabit Ethernet type of interface. One or more of interfaces 662 can be implemented as a Secure Digital (SD) type of interface.

The I/O subsystem 650 may also include one or more interfaces 666 such as interfaces 666A-666D that provide a lower level of performance than interfaces 662. For example, one or more of interfaces 666 can be implemented as a General Purpose I/O (GPIO) type of interface. One or more of interfaces 666 can be implemented as a Universal Asynchronous Receiver/Transmitter (UART) type of interface. One or more of interfaces 666 can be implemented in the form of a Serial Peripheral Interface (SPI) bus type of interface. One or more of interfaces 666 can be implemented in the form of a Controller-Area-Network (CAN) type of interface and/or an inter-integrated circuit ($I^2C$) type of interface. One or more of interfaces 666 also can be implemented in the form of a timer type of interface. The I/O subsystem 650 can include the debug port 120 as described above.

As shown, each of interfaces 660, 662, 666, and debug port 120 can be coupled to a multiplexer 670. Multiplexer 670 provides a plurality of outputs that can be directly routed or coupled to external pins of the programmable IC 602, e.g., balls of the package within which the programmable IC 602 is disposed. For example, I/O pins of programmable IC 602 can be shared among interfaces 660, 662, 666, and debug port 120. A user can configure multiplexer 670, via a configuration data stream to select which of interfaces 660-666 and debug port 120 are to be used and, therefore, coupled to I/O pins of programmable IC 602 via multiplexer 670. The I/O subsystem 650, may also include a fabric multiplexer I/O (FMIO) interface (not shown) to connect interfaces 660-666 to programmable logic circuits of the programmable logic subsystem. Additionally or alternatively, the programmable logic subsystem 630 can be configured to implement one or more I/O circuits within programmable logic. In some implementations, the programmable IC 602 may also include a subsystem 640 having various circuits for power and/or safety management. For example, the subsystem 640 may include a power management unit 646 configured to monitor and maintain one or more voltage domains used to power the various subsystems of the programmable IC 602. In some implementations, the power management unit 646 may disable power of individual subsystems, when idle, to reduce power consumption, without disabling power to subsystems in use. The debug interface for the power/platform manger can be accessed directly by Debug Packet Controller through Memory operation codes. This allows a user to debug the firmware/code that runs on the platform management controller.

The subsystem 640 may also include safety circuits to monitor the status of the subsystems to ensure correct operation. For instance, the subsystem 640 may include one or more real-time processors 642 configured to monitor the status of the various subsystems (e.g., as indicated in status registers 644). The real-time processors 642 may be configured to perform a number of tasks in response to detecting errors. For example, for some errors, the real-time processors 642 may generate an alert in response to detecting an error. As another example, the real-time processors 642 may reset a subsystem to attempt to restore the subsystem to correct operation. The subsystem 640 includes a switch network 648 that may be used to interconnect various subsystems. For example, the switch network 648 may be configured to connect the various subsystems 610, 630, and 640 to various interfaces of the I/O subsystem 650. In some applications, the switch network 648 may also be used to isolate the real-time processors 642 from the subsystems that are to be monitored. Such isolation may be required by certain application standards (e.g., IEC-61508 SIL3 or ISO-26262 standards) to ensure that the real-time processors 642 are not affected by errors that occur in other subsystems.

Though aspects and features may in some cases be described in individual figures, it will be appreciated that features from one figure can be combined with features of another figure even though the combination is not explicitly shown or explicitly described as a combination.

The disclosed circuits and methods are thought to be applicable to a variety of systems for debugging SoCs. Other aspects and features will be apparent to those skilled in the art from consideration of the specification. The circuits and methods may be implemented as one or more processors configured to execute software, as an application specific integrated circuit (ASIC), or as a logic on a programmable logic device. It is intended that the specification and drawings be considered as examples only, with a true scope of the invention being indicated by the following claims.

What is claimed is:

1. A circuit arrangement comprising:
one or more input buffers disposed on a system-on-chip (SoC) and configured to receive and store a plurality of streaming debug packets;

a decoder circuit disposed on the SoC and configured to
signal a first mode in response to an operation code in
a debug packet of the plurality of streaming debug
packets specifying perpetual operation, and signal a
second mode in response to an operation code in a
debug packet of the plurality of streaming debug packets specifying stopping perpetual operation;
one or more response buffers disposed on the SoC; and
a transaction control circuit disposed on the SoC and
coupled to the one or more input buffers and to the one
or more response buffers, wherein the transaction control circuit is configured to:
process each debug packet in the one or more input
buffers by:
decoding an operation code in the debug packet,
determining from an address in the debug packet, an
interface circuit of a plurality of interface circuits
to access a storage circuit in a subsystem of a
plurality of sub-systems on the SoC,
issuing a request via the interface circuit to access
the storage circuit according to the operation code,
and
storing responses and data received from the plurality of interface circuits in the one or more response
buffers;
repeat the process on each debug packet in the one or
more input buffers in response to the first mode; and
perform the process once on each debug packet in the
one or more input buffers, in response to the second
mode.

2. The circuit arrangement of claim 1, wherein the transaction control circuit is further configured to:
in response to the first mode,
determine, in response to an input debug packet of the
plurality of streaming debug packets, if space is
available in the one or more input buffers for the
input debug packet, and
store, in response to determining that space is available,
the input debug packet in one of the one or more
input buffers.

3. The circuit arrangement of claim 1, wherein one debug
packet in the one or more input buffers includes a plurality
of operation codes, and the transaction control circuit is
further configured to repeat, for each operation code of the
plurality of operation codes in the one debug packet, the
decoding of the operation code, determining the interface
circuit, and issuing the request.

4. The circuit arrangement of claim 1, wherein the transaction control circuit includes a condition register, and the
transaction control circuit is further configured to, in
response to the operation code in one debug packet in the
one or more input buffers specifying a test-memory operation code and specifying a compare value and a mask value
associated with the test-memory operation code:
issue a read request to read a data value from the storage
circuit;
perform a logic function using the data value and the mask
value as operands, wherein the logic function generates
a result value;
compare the result value to the compare value;
set the condition register to a first value in response to the
result value being equal to the compare value; and
setting the condition register to a second value in response
to the result value being not equal to the compare value.

5. The circuit arrangement of claim 1, wherein the transaction control circuit includes a condition register, and the
transaction control circuit is further configured to, in
response to the operation code in one debug packet in the
one or more input buffers specifying a test-condition operation code and specifying a compare value and a mask value
associated with the test-condition operation code:
read a data value from the condition register;
perform a logic function using the data value and the mask
value as operands, wherein the logic function generates
a result value;
compare the result value to the compare value;
set the condition register to a first value in response to the
result value being equal to the compare value; and
set the condition register to a second value in response to
the result value being not equal to the compare value.

6. The circuit arrangement of claim 1, wherein one debug
packet in the one or more input buffers includes a plurality
of operation codes, one of the operation codes is a skip
operation code, the transaction control circuit includes a
condition register, and the transaction control circuit is
further configured to:
bypass, in response to decoding the skip operation code
and a value in the condition register being equal to a
condition value associated with the skip operation code
in the one debug packet, processing of one or more
operation codes that follow the skip operation code in
the one debug packet.

7. The circuit arrangement of claim 1, wherein:
the transaction control circuit is further configured, in the
determining of the interface circuit, to determine if the
address in the debug packet references a storage circuit
of a processor subsystem on the SoC, a storage circuit
of a programmable logic subsystem on the SoC, or a
storage circuit of a math engine circuit on the SoC.

8. The circuit arrangement of claim 1, further comprising:
an output selection circuit coupled to the transaction
control circuit, coupled to the one or more response
buffers, and coupled to receive the plurality of streaming debug packets;
wherein the decoder circuit is configured to:
compare a target identifier in each debug packet to an
SoC identifier of the SoC, and
signal the transaction control circuit in response to the
target identifier being unequal to the SoC identifier in
one of the debug packets; and
wherein the transaction control circuit is further configured to bypass storage of the one of the debug packets
in the one or more input buffers and control output
selection circuit to select the one of the debug packets
for output, in response to the signal indicating the target
identifier is unequal to the SoC identifier.

9. A system-on-chip (SOC), comprising:
an integrated circuit (IC) die;
a plurality of circuit subsystems disposed on the IC die;
a plurality of interface circuits configured to access storage circuits in the plurality of circuit subsystems; and
a debug circuit disposed on the IC die and coupled to the
plurality of interface circuits, the debug circuit including:
one or more input buffers configured to receive and
store a plurality of streaming debug packets;
a decoder circuit disposed on the SoC and configured to
signal a first mode in response to an operation code
in a debug packet of the plurality of streaming debug
packets specifying perpetual operation, and signal a
second mode in response to an operation code in a
debug packet of the plurality of streaming debug
packets specifying stopping perpetual operation;
one or more response buffers; and a transaction control circuit coupled to the one or more input buffers and to the one or more response buffers, wherein the transaction control circuit is configured to:
    process each debug packet in the one or more input buffers by:
        decoding an operation code in the debug packet,
        determining from an address in the debug packet, one interface circuit of the plurality of interface circuits to access one or more storage circuits in one of the plurality of circuit subsystems,
        issuing a request via the one interface circuit to access the one or more storage circuits according to the operation code, and
        storing responses and data received from the plurality of interface circuits in the one or more response buffers;
    repeat the process on each debug packet in the one or more input buffers in response to the first mode; and
    perform the process once on each debug packet in the one or more input buffers, in response to the second mode.

10. The SoC of claim 9, wherein the transaction control circuit is further configured to:
    in response to the first mode,
        determine, in response an input debug packet of the plurality of streaming debug packets, if space is available in the one or more input buffers for the input debug packet, and
        store, in response to determining that space is available, the input debug packet in one of the one or more input buffers.

11. The SoC of claim 9, wherein one debug packet in the one or more input buffers includes a plurality of operation codes, and the transaction control circuit is further configured to repeat, for each operation code of the plurality of operation codes in the one debug packet, the decoding of the operation code, determining the interface circuit, and issuing the request.

12. The SoC of claim 9, wherein the transaction control circuit includes a condition register, and the transaction control circuit is further configured to, in response to the operation code in one debug packet in the one or more input buffers specifying a test-memory operation code and specifying a compare value and a mask value associated with the test-memory operation code:
    issue a read request to read a data value from the storage circuit;
    perform a logic function using the data value and the mask value as operands, wherein the logic function generates a result value;
    compare the result value to the compare value;
    set the condition register to a first value in response to the result value being equal to the compare value; and
    set the condition register to a second value in response to the result value being not equal to the compare value.

13. The SoC of claim 9, wherein the transaction control circuit includes a condition register, and the transaction control circuit is further configured to, in response to the operation code in one debug packet in the one or more input buffers specifying a test-condition operation code and specifying a compare value and a mask value associated with the test-condition operation code:
    read a data value from the condition register;
    perform a logic function using the data value and the mask value as operands, wherein the logic function generates a result value;
    compare the result value to the compare value;
    set the condition register to a first value in response to the result value being equal to the compare value; and
    set the condition register to a second value in response to the result value being not equal to the compare value.

14. The SoC of claim 9, wherein one debug packet in the one or more input buffers includes a plurality of operation codes, one of the operation codes is a skip operation code, the transaction control circuit includes a condition register, and the transaction control circuit is further configured to:
    bypass, in response to decoding the skip operation code and a value in the condition register being equal to a condition value associated with the skip operation code in the one debug packet, processing of one or more operation codes that follow the skip operation code in the one debug packet.

15. The SoC of claim 9, wherein:
the transaction control circuit is further configured, in the determining of the interface circuit, to determine if the address in the debug packet references a storage circuit of a processor subsystem on the SoC, a storage circuit of a programmable logic subsystem on the SoC, or a storage circuit of a math engine circuit on the SoC.

16. The SoC of claim 9, further comprising:
an output selection circuit coupled to the transaction control circuit, coupled to the one or more response buffers, and coupled to receive the plurality of streaming debug packets;
    compare a target identifier in each debug packet to an SoC identifier of the SoC, and
    signal the transaction control circuit in response to the target identifier being unequal to the SoC identifier in one of the debug packets; and
wherein the transaction control circuit is further configured to bypass storage of the one of the debug packets in the one or more input buffers and control output selection circuit to select the one of the debug packets for output, in response to the signal indicating the target identifier is unequal to the SoC identifier.

17. A method, comprising:
signaling by a decoder circuit, a first mode in response to an operation code in a debug packet of a plurality of streaming debug packets specifying perpetual operation, and signaling a second mode in response to an operation code in a debug packet of the plurality of streaming debug packets specifying stopping perpetual operation;
receiving and storing the plurality of streaming debug packets in one or more input buffers disposed on a system-on-chip (SoC);
processing each debug packet in the one or more input buffers by a transaction control circuit disposed on the SoC, the processing including:
    decoding an operation code in the debug packet,
    determining from an address in the debug packet, one interface circuit of a plurality of interface circuits disposed on the SoC to access one or more storage circuits in one of a plurality of circuit sub-systems disposed on the SoC,
    issuing a request via the one interface circuit to access the one or more storage circuits according to the operation code, and storing responses and data received from the plurality of interface circuits in one or more response buffers disposed on the SoC;
repeating the processing on each debug packet in the one or more input buffers in response to the first mode; and
performing the processing once on each debug packet in the one or more input buffers, in response to the second mode.

18. The method of claim 17, further comprising:
in the first mode,
   determining, in response to an input debug packet of the plurality of streaming debug packets, if space is available in the one or more input buffers for the input debug packet, and
   storing, in response to determining that space is available, the input debug packet in one of the one or more input buffers.

19. The method of claim 17, wherein one debug packet in the one or more input buffers includes a plurality of operation codes, and the method further comprising repeating, for each operation code of the plurality of operation codes in the one debug packet, the decoding of the operation code, determining the interface circuit, and issuing the request.

20. The method of claim 17, wherein the determining of the interface circuit includes determining if the address in one debug packet in the one or more input buffers references a storage circuit of a processor subsystem on the SoC, a storage circuit of a programmable logic subsystem on the SoC, or a storage circuit of a math engine circuit on the SoC.

\* \* \* \* \*